US006803621B2

United States Patent
Yang et al.

(10) Patent No.: US 6,803,621 B2
(45) Date of Patent: Oct. 12, 2004

(54) OXYGEN BARRIER FOR CELL CONTAINER PROCESS

(75) Inventors: Sam Yang, Boise, ID (US); Lingyi A. Zheng, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/286,155

(22) Filed: Oct. 31, 2002

(65) Prior Publication Data

US 2003/0064566 A1 Apr. 3, 2003

Related U.S. Application Data

(62) Division of application No. 09/902,997, filed on Jul. 11, 2001.

(51) Int. Cl.[7] .............................................. H01L 27/108
(52) U.S. Cl. ........................ 257/306; 257/309; 257/751
(58) Field of Search ................................ 257/306, 309, 257/751

(56) References Cited

U.S. PATENT DOCUMENTS

| | | | |
|---|---|---|---|
| 5,835,314 A | 11/1998 | Moodera et al. | |
| 5,960,294 A | * 9/1999 | Zahurak et al. | ............ 438/398 |
| 6,090,655 A | 7/2000 | Zahurak et al. | |
| 6,162,744 A | 12/2000 | Al-Shareef et al. | |
| 6,204,142 B1 | 3/2001 | Thakur | |
| 6,281,142 B1 | * 8/2001 | Basceri et al. | ............ 438/771 |
| 6,372,598 B2 | 4/2003 | Kang et al. | |
| 2003/0013265 A1 | * 1/2003 | Yang et al. | ................ 438/398 |

* cited by examiner

Primary Examiner—Mark V. Prenty
(74) Attorney, Agent, or Firm—TraskBritt (57) ABSTRACT

A memory cell container of a DRAM semiconductor memory device and method for manufacturing the cell container are provided. The cell includes a container formed in a structural layer such as borophosphosilicate glass. The container is then lined with a polysilicon such as hemispherical grained polysilicon. A dielectric layer is deposited over the polysilicon layer. A barrier layer is deposited over the dielectric layer such that the opening of the container is covered but not the sidewalls or the bottom of the container. The cell is then oxidized and the barrier layer provides protection as an oxygen barrier during the oxidation or any following reoxidation process.

25 Claims, 4 Drawing Sheets

OXYGEN BARRIER FOR CELL CONTAINER PROCESS

CROSS-REFERENCE TO RELATED APPLICATION

This application is a divisional of application Ser. No. 09/902,997, filed Jul. 11, 2001, pending.

BACKGROUND OF THE INVENTION

1. Field of the Invention

The present invention relates generally to computer memory devices and, more specifically, to capacitor cell containers formed in such semiconductor memory devices.

2. State of the Art

Computer memory devices, such as DRAM (dynamic random access memory) semiconductor device modules, utilize a series or an array of capacitors to store charge in retaining digital data for subsequent recall. Each capacitor is coupled to a transistor and includes a cell which holds a charge representative of a bit of data (i.e., a "1" or a "0") depending on the charge of the cell. An array of capacitors, with a plurality of them holding a charge, allows for digital information to be stored in a compact and efficient manner which may be recalled by examining the charge on each capacitor. However, DRAM type memory requires constant refreshing at a rapid rate due to leakage from the capacitors. Thus, one of the inherent inefficiencies of DRAM type semiconductor device memory is the time and power utilized in the continual refreshing of the array of capacitors.

With the rapid advance in computer technology, DRAM semiconductor device memory modules have been designed with a higher density of memory cells. While such density of memory cells has led to expanded capacity in a smaller package, it has also produced new design challenges. For example, regardless of how small or how dense a storage cell array is packaged, each cell must hold a minimum amount of charge. Thus, in a high-density memory cell array, the ability to retain the minimum level of charge in a smaller volume memory needs to be addressed. One method of addressing such an issue has been to increase the effective surface area of the memory cell, and thus the electrode associated with the memory cell.

Figure 1:
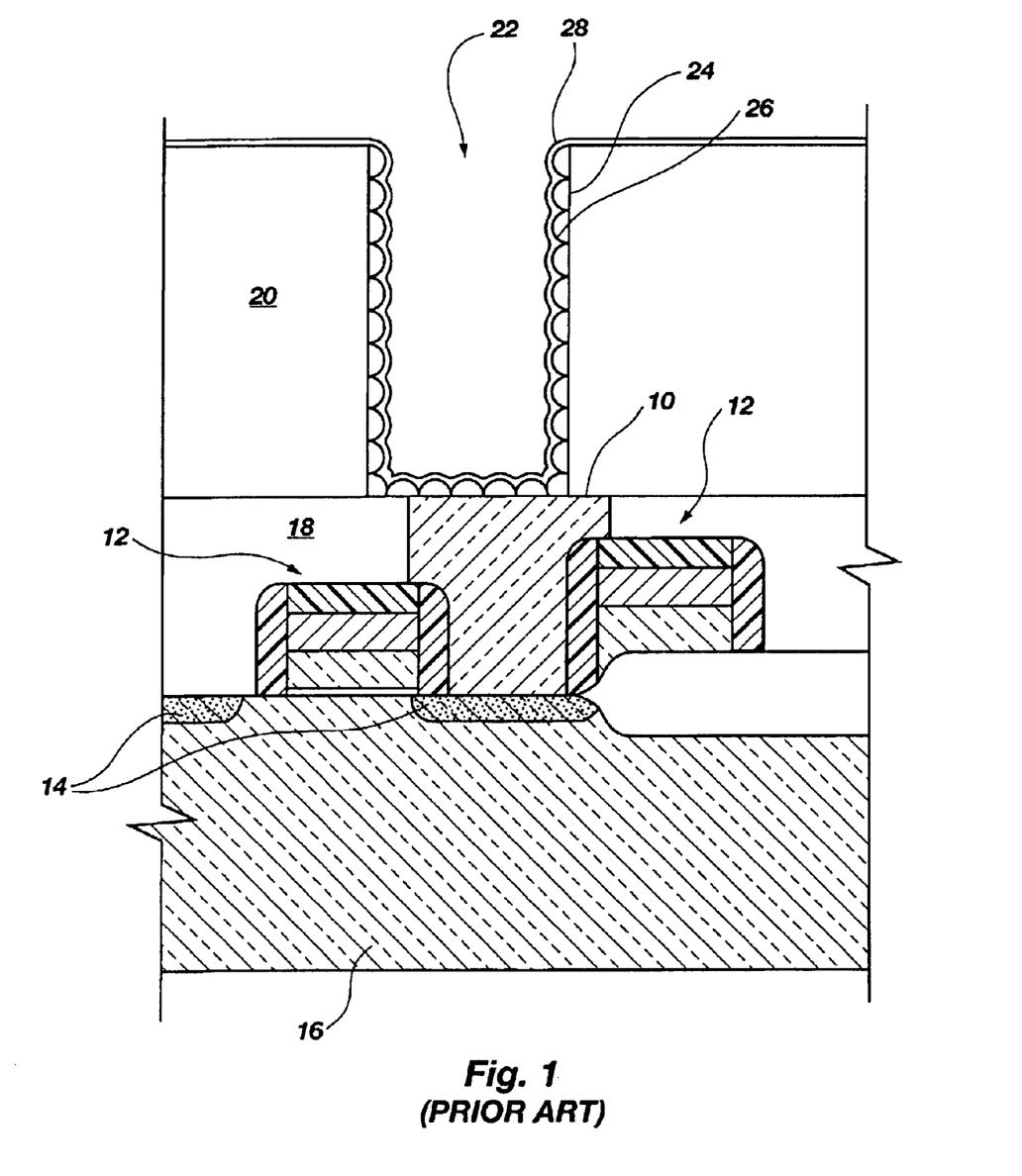
FIG. 1 is a partial sectional view of a prior art cell container of a DRAM module.

An example of increasing the surface area of a capacitor memory cell container may be seen in drawing FIG. 1, which shows a prior art partially fabricated memory cell within an integrated circuit such as a DRAM semiconductor memory device or chip. A conductive plug 10 located between neighboring word lines 12, usually comprising polysilicon, forms electrical contact with an active area 14 of a semiconductor substrate 16. A planarized insulating layer 18, such as borophosphosilicate glass (BPSG), surrounds the word lines 12. The conductive plug 10 is formed within an opening through the insulating layer 18. A structural layer 20 overlies the insulating layer 18 and may also be composed of BPSG or similar material. A container 22 is formed in the structural layer, generally by anisotropically etching the structural layer 20 through a mask. The container 22 is generally a cylindrical cavity formed contiguous with the conductive plug 10 and includes sidewalls 24 which extend to an opening in the structural layer 20. A layer 26 of hemispherical grained (HSG) polysilicon covers the interior surface of the container 22. The HSG layer 26 increases the surface area of the cell container 22 due to the hemispherical arrangement and patterning of the silicon. By increasing the surface area of the memory cell container, and thus an associated electrode, capacitance charge may be increased for a generally smaller cell container.

A thin layer of nitride 28 is deposited over the HSG layer 26 as well as the surface of the structural layer 20. It is noted that the layer of nitride 28 grows much thinner over the surface of the BPSG structural layer 20 than on the HSG layer 26 due to the large nucleation incubation time of silicon nitride on BPSG. The slower growth of cell nitride on the BPSG layer 20 results in various problems. One problem is that the thin layer of nitride 28 on the structural layer 20 fails to effectively block oxygen during processes such as oxidation or followed oxidation (reox). The inefficiency of the thin cell layer of nitride 28 allows oxygen to pass through the structural layer 20, resulting in the oxidation of the HSG layer 26. Of course, the amount of oxidation depends on the actual thickness of the layer of nitride 28 above the structural layer 20. Additionally, the thin layer of nitride 28 allows for current leakage at the edge of the container 22, thus creating an additional inefficiency with regard to the operation of the capacitor cell structure.

In view of the shortcomings in the art, it would be advantageous to provide a memory cell structure and a method for forming such a structure that assists in preventing oxidation of the cell plate. Further, it would be advantageous to provide a structure which is simple to manufacture and a method which does not significantly interfere with existing manufacturing processes. It would also be advantageous to provide a memory cell structure and method for manufacturing the structure with reduced current leakage at the edge of the cell container, thus improving the overall efficiency of the memory cell.

BRIEF SUMMARY OF THE INVENTION

In accordance with one aspect of the invention, a method of forming a cell container for the capacitor of a memory device, such as a DRAM semiconductor memory device or chip or module, is provided. The method includes forming a structural layer above a conductive plug. A cavity is formed in the structural layer, such as by etching. The cavity includes at least one sidewall, such as a continual sidewall in a cylinder, a bottom surface which is contiguous with the conductive plug, and an opening at the upper surface of the structural layer. A layer of polysilicon is deposited over the bottom and sidewall of the cavity. A dielectric, such as a nitride layer, is formed over the polysilicon layer and at least a portion of the upper surface of the structural layer including the area surrounding the opening of the cavity at the opening thereof. A barrier layer is deposited over at least a portion of the dielectric layer including the area surrounding the opening of the cavity and a portion of the sidewall adjacent the opening. The barrier layer is deposited such that the majority of the sidewall as well as the bottom surface are not covered with the barrier layer. The container may then be subjected to an oxidation process wherein the barrier layer is oxidized and acts as an oxygen barrier for the structural layer.

The structural layer may be formed of BPSG with the polysilicon layer being formed of a hemispherical grained polysilicon to improve the surface area of the cell container. The dielectric layer may be formed of silicon nitride. Aluminum is a suitable material for the barrier layer and may be deposited by sputtering the aluminum on to help keep the aluminum layer from substantially covering the interior cell surface. Other metallic materials are also suitable, such as tantalum, zirconium, hafnium, tungsten, titanium or aluminum nitride. The formation of the metallic layer provides an oxygen barrier for the cell structure during oxidation processes as well as leakage protection for the cell at the opening edge.

In accordance with another aspect of the invention, a memory cell container is provided. The memory cell includes a cavity formed in a structural layer such as BPSG. The cavity is formed to have a bottom, which is contiguous with a conductive plug, and a sidewall extending from the bottom of the cavity to an opening at the upper surface of the structural layer. A polysilicon layer, such as HSG polysilicon, is deposited in the cavity on the bottom and along the sidewall. A nitride layer, such as silicon nitride, is formed over the polysilicon layer and at least a portion of the upper surface of the structural layer. A barrier layer, such as aluminum, covers at least a portion of the nitride above the structural layer and a small portion of the nitride along the sidewall of the cavity adjacent the opening. The barrier layer forms an oxygen barrier for the cell container and also protects against edge leakage during operation. As with the method, various materials may be utilized to form the cell container, including various materials cited for the barrier layer.

In accordance with another aspect of the invention, a memory device is provided which includes a substrate having an array of capacitors formed therein. At least one of the capacitors includes a cell container similar to that described above including the metallic layer formed as an oxygen barrier.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 2A:
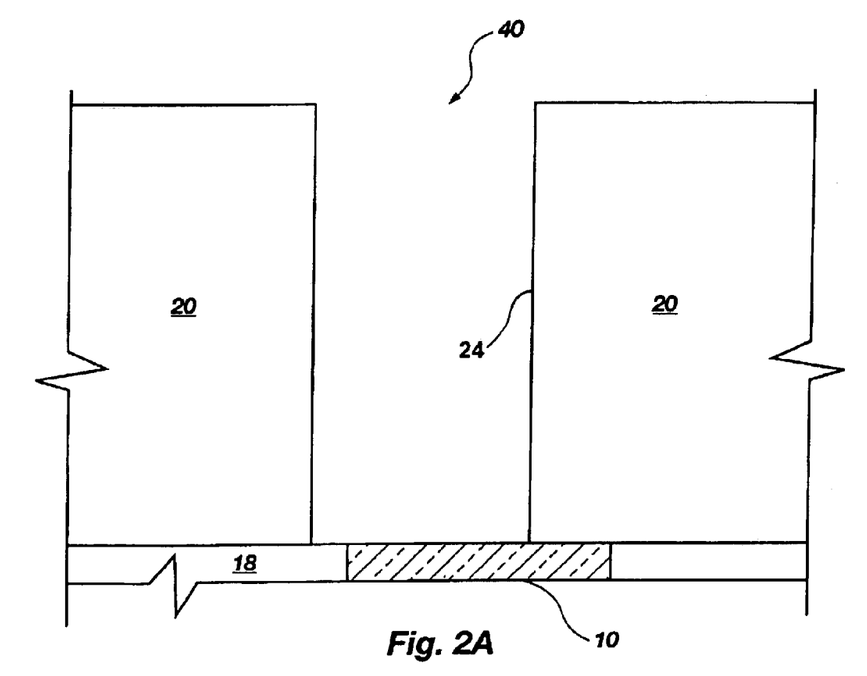
FIGS. 2A–2F show partial sectional views of a cell container for a DRAM module and a method of making such according to one aspect of the present invention.

Referring first to drawing FIG. 2A, a cell container 40 is shown at an early stage of manufacturing. It is noted that manufacture of such cells is carried out with respect to multiple cells and cell containers 40 substantially simultaneously; however, for sake of clarity, only one such cell container is depicted in the drawings. The cell container 40 is formed above a conductive plug 10 and a planarized insulating layer 18 similar to that previously discussed. However, for sake of convenience, various other components associated with the memory cell such as the word lines, active areas, or the semiconductor substrate are not shown in drawing FIGS. 2A through 2F. To form the cell container 40, a structural layer 20, such as BPSG, is deposited above the planarized insulating layer 18 utilizing techniques and processes known by those of skill in the art. A masked etching process then forms several openings, typically cylindrical in geometry, contiguous with the conductive plug 10 and having sidewalls 24 which extend upwards therefrom.

Figure 2B:
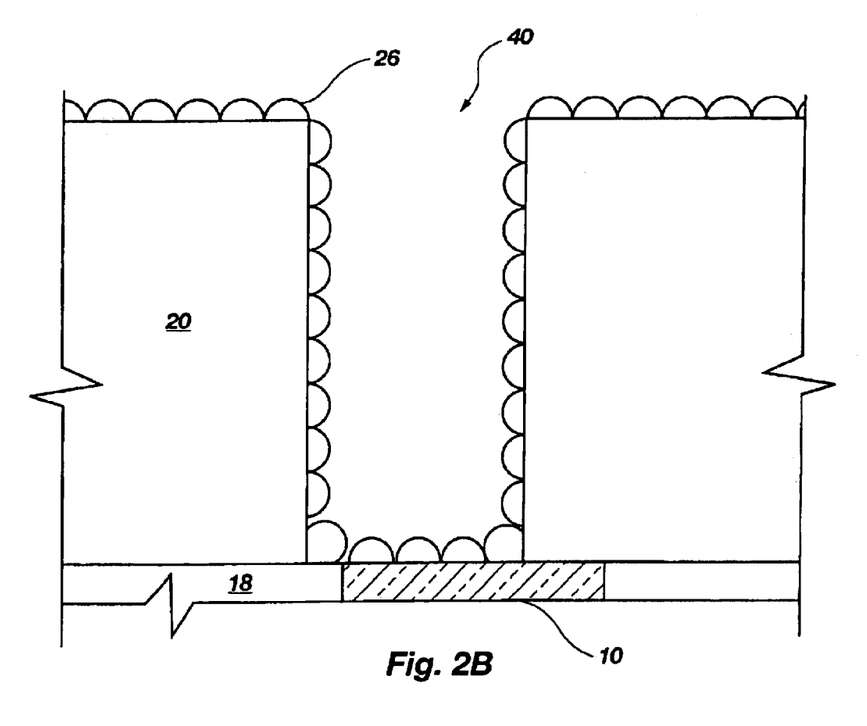
Figure 2C:
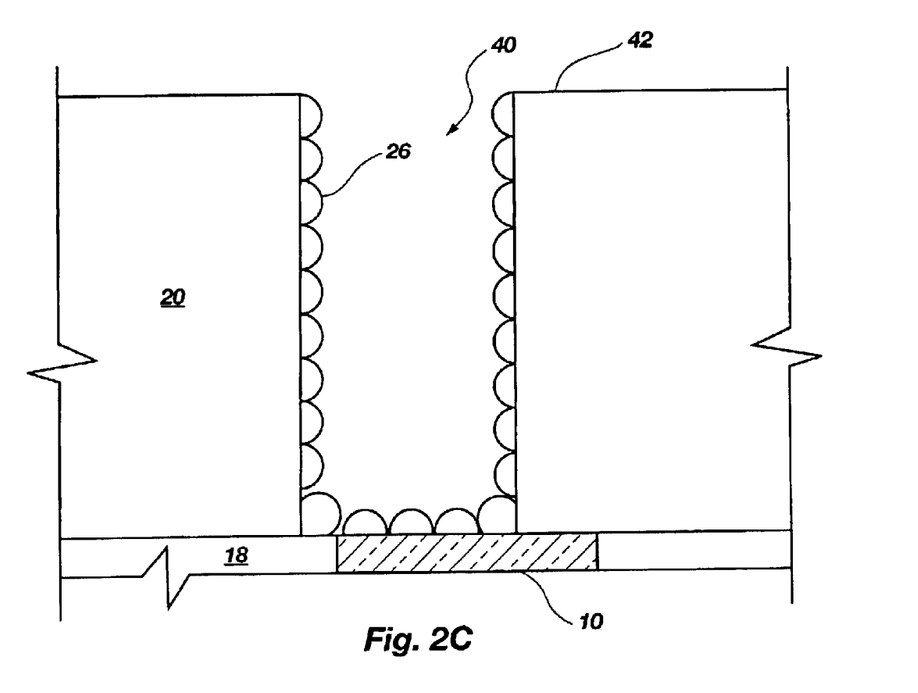
Figure 2D:
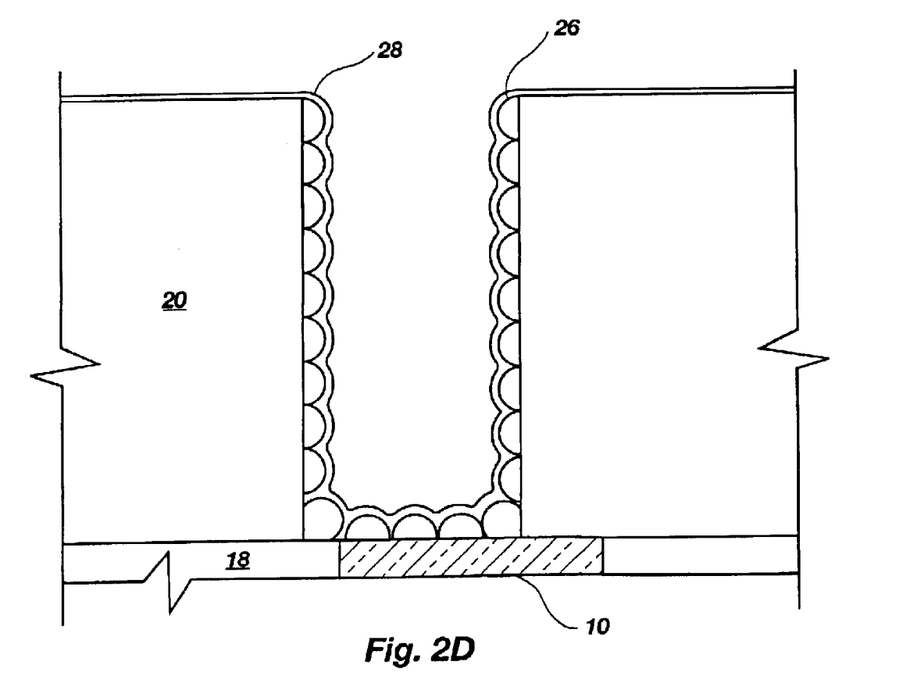

As shown in drawing FIG. 2B, an HSG polysilicon layer 26 is deposited over the structural layer 20. The HSG layer 26 may be formed by various methods known in the art, including low pressure CVD (LPCVD) and silicon deposition followed by vacuum anneal under specified temperature and pressure conditions. The HSG layer 26 may also be doped for greater conductivity. The formation of an HSG layer 26 is discussed in greater detail in U.S. Pat. No. 6,090,655 issued to Zahurak et al., assigned to the assignee of the present invention and incorporated by reference herein. As discussed above, the HSG layer 26 provides a rough or textured surface, thus increasing the surface area, as well as the capacitance of the cell container 40. The grain size of the HSG layer may vary depending on the volume of the cell container 40 and the desired surface area of the container.

Subsequent to the formation of the HSG layer 26, the layer 26 may be planarized for isolation of the memory cells on the array as shown in drawing FIG. 2C, thus again exposing the upper surface 42 of the structural layer 20 in preparation for further processing. A dielectric layer 28 (also referred to as a layer of nitride 28) is then deposited over the HSG layer 26 as well as the planarized structural layer 20 as seen in drawing FIG. 2D. The dielectric layer 28 is conformally deposited according to the methods and processes known to those of skill in the art. It is contemplated that the dielectric layer 28 is formed of silicon nitride, such as $Si_3N_4$; however, it is noted that other suitable dielectric materials may be utilized in conjunction with the present invention, such as, oxynitride.

Figure 2E:
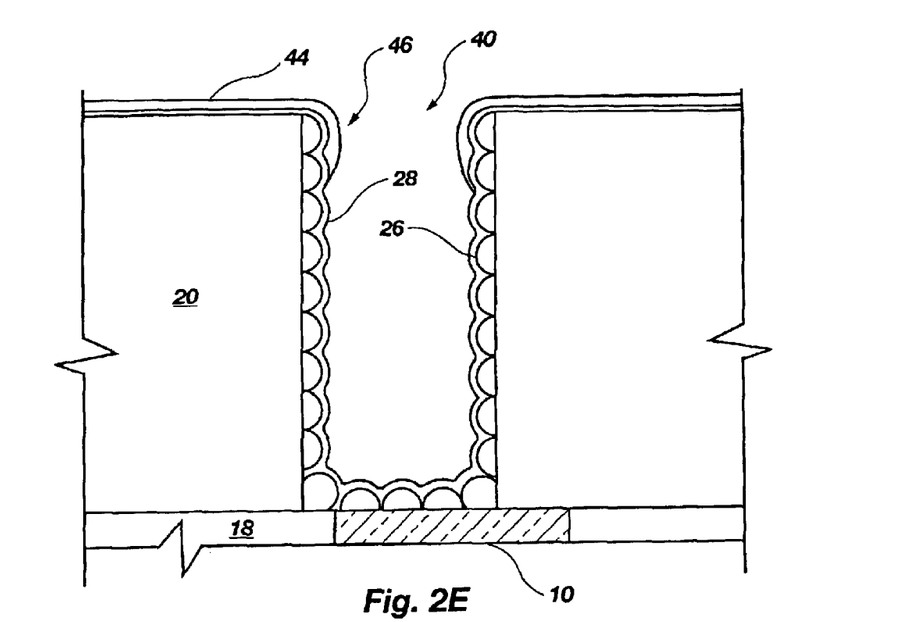

After the dielectric layer 28 has been deposited, a thin barrier layer 44, such as aluminum, is deposited such that it covers the dielectric layer 28 above the upper surface 42 of the structural layer 20 as well as partially into the cell container 40 about the rim 46 thereof. Such deposition may be accomplished by a low-step-coverage sputtering process after the dielectric layer 28 has been deposited. Techniques such as low-angle or high-vacuum application may be used in the sputtering process to ensure that the metallic layer is deposited on the top part or rim 46 of the cell container 40 without significantly depositing metal along the sidewalls or bottom surface of the cell container 40. While aluminum is contemplated for use as the metallic layer, other metals may be properly utilized in conjunction with the present invention. For example, tantalum, zirconium, hafnium, tungsten, titanium, aluminum nitride, and their oxides may be used for the barrier layer 44. It should be understood that the barrier layer 44 will form an oxygen barrier for those areas that it covers. To form the desired oxygen barrier, the barrier layer can be formed by one of at least two methods. The barrier layer 44 may be formed by directly sputtering a metallic layer to cover the dielectric layer 28 above the upper surface 42 of the structural layer 20 as well as partially into the cell container 40 about the rim 46 thereof and then converting the metallic layer to a metallic oxide barrier layer 44 by an oxidation process. When the metallic barrier layer 44, a conductive layer, is converted by oxidation from a metallic barrier layer 44 to a metallic oxide barrier layer 44, the metallic oxide barrier layer 44 becomes an insulation layer and is no longer conductive. If the barrier layer 44 is to be formed as a metallic oxide layer in-situ, such a metallic oxide barrier layer 44 may be formed by the reactive sputtering of metal in an oxidizing ambient atmosphere. In either event, whether the barrier layer 44 is either sputtered and then converted to a metallic oxide layer by an external oxidation process or is formed in-situ by the reactive sputtering of a metal in an oxidizing ambient atmosphere, the resulting metallic oxide barrier layer 44 has a higher dielectric constant than that of silicon nitride. Therefore, the formation of the metallic oxide barrier layer 44 does not affect the electrical performance of the capacitor cell container 40 but, rather, functions as an oxygen diffusion barrier regarding the surrounding areas that the metallic oxide barrier layer 44 covers after formation to prevent the diffusion of oxygen thereinto. When the metallic barrier layer 44 is deposited as a metal and subjected to an external oxidation process, the metallic barrier layer 44 of the cell container 40 is oxidized at relatively low temperatures in an oxidizing ambient environment, such as $O_2$, $O_3$, $N_2O$ or $H_2O$ with or without the aid of plasma enhancement. Thus, for example, deposited aluminum barrier layer 44 would be oxidized to form aluminum oxide ($Al_2O_3$). The aluminum oxide may also be formed after the aluminum barrier layer 44 is deposited during a followed cell nitride reoxidation step, thus eliminating the need for an extra oxidation step. Subsequent oxidation of the metallic barrier layer 44 converts the metallic barrier layer 44 to a metallic oxide layer which has a high dielectric constant and preferably higher than the layer of nitride 28 upon which it is deposited. Additionally, it is expected that the resulting thickness of the metallic oxide barrier layer 44 be in the range of approximately 20–200 Å.

The existence of the barrier layer 44 allows for oxidation of the cell container 40, including the layer of nitride 28, to take place without oxygen leaking through the structural layer 20. As noted previously, oxygen leaking through the structural layer 20 would result in damage to the bottom cell layer such as the HSG layer 26. Furthermore, the barrier layer 44 serves as a barrier to current leakage through the edge or rim 46 of the cell container 40, thus improving the efficiency of the cell container in operation.

It is noted that while sputtering of the barrier layer 44 allows for deposition of the material in a manner which does not sufficiently form an extraneous layer within the cell container itself (i.e., the cell walls and floor), formation of such would not be detrimental to the operative capacity or does not affect the operative characteristics of the memory cell using cell container 40. The barrier layer 44 has no discernible or minimum impact, if any at all, upon cell capacitance in the case that limited material is formed within the cell container 40 itself. Further, the limited material falling into the cell container will be converted into a metallic oxide in the oxidation step or process. As such, the metallic oxide layer of material for the metals described herein will have a higher dielectric constant than the silicon nitride and, therefore, will have little effect on the capacitor's electrical performance.

Figure 2F:
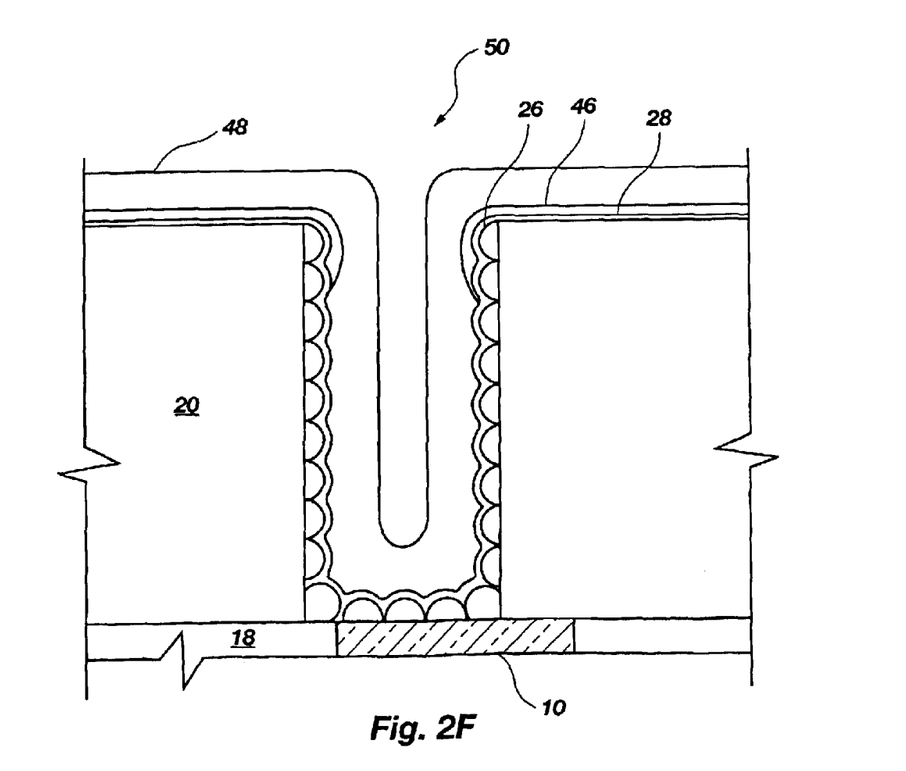

A conductive top electrode layer 48 is deposited in the cell container 40 and above the metallic barrier layer 44 to form the resulting capacitive memory cell 50. The top electrode layer 48 may be formed, for example, of polysilicon, titanium nitride or even a silicide according to processes understood by those of skill in the art.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory cell container comprising:
    a cavity formed in a structural layer, the cavity having a bottom and at least one sidewall extending from the bottom to an opening in a surface of the structural layer;
    a polysilicon layer covering the bottom and the at least one sidewall of the cavity;
    a nitride layer covering the polysilicon layer and at least a portion of the surface of the structural layer; and
    a barrier-layer forming an oxygen barrier for the cell container, said barrier layer being comprised of a material having a dielectric constant greater than that of the nitride layer, and covering only a portion of the nitride layer including an area around the opening in the surface of the structural layer and partially along the at least one sidewall within the cavity, said barrier layer including one of aluminum oxide, zirconium, hafnium, aluminum nitride, a metallic oxide layer having a higher dielectric constant than the nitride layer, and tungsten oxide.

2. The memory cell container of claim 1, wherein the nitride layer includes silicon nitride.

3. The memory cell container of claim 1, wherein the polysilicon layer includes a hemispherical grained polysilicon.

4. The memory cell container of claim 1, wherein the structural layer includes borophosphosilicate glass.

5. The memory cell container of claim 1, wherein the barrier layer comprises aluminum oxide.

6. The memory cell container of claim 1, wherein the barrier layer comprises zirconium.

7. The memory cell container of claim 1, wherein the barrier layer comprises hafnium.

8. The memory cell container of claim 1, wherein the barrier layer comprises tungsten oxide.

9. The memory cell container of claim 1, wherein the barrier layer comprises aluminum nitride.

10. The memory cell container of claim 1, wherein the barrier layer comprises a metallic oxide layer having a higher dielectric constant than the nitride layer.

11. The memory cell container of claim 1, wherein the barrier layer is a sputtered layer.

12. The memory cell container of claim 1, wherein the bottom of the cavity is contiguous with a conductive plug.

13. A memory device comprising:
    a substrate;
    an array of capacitors formed in the substrate, at least one of the array of capacitors including a cell container comprising:
        a cavity formed in a structural layer, the cavity having a bottom and at least one sidewall extending from the bottom to an opening in a surface of the structural layer;
        a polysilicon layer covering the bottom and the at least one sidewall of the cavity;
        a nitride layer covering the polysilicon layer and at least a portion of the surface of the structural layer; and
        a barrier layer forming an oxygen barrier for the cell container, said barrier layer being comprised of a material having a dielectric constant greater than that of the nitride layer, and covering only a portion of the nitride layer including an area around the opening in the surface of the structural layer and partially along the at least one sidewall within the cavity, said barrier layer including one of aluminum oxide, zirconium, hafnium, aluminum nitride, a metallic oxide layer having a higher dielectric constant than the nitride layer, and tungsten oxide.

14. The memory device of claim 13, wherein the nitride layer includes silicon nitride.

15. The memory device of claim 14, wherein the polysilicon layer includes a hemispherical grained polysilicon.

16. The memory device of claim 15, wherein the structural layer includes borophosphosilicate glass.

17. The memory device of claim 13, wherein the barrier layer comprises aluminum oxide.

18. The memory device of claim 13, wherein the barrier layer comprises zirconium.

19. The memory device of claim 13, wherein the barrier layer comprises hafnium.

20. The memory device of claim 13, wherein the barrier layer comprise tungsten oxide.

21. The memory device of claim 13, wherein the barrier layer comprises aluminum nitride.

22. The memory device of claim 13, wherein the barrier layer comprises a metallic oxide layer having a higher dielectric constant than the nitride layer.

23. The memory device of claim 13, wherein the barrier layer is a sputtered layer.

24. The memory device of claim 13, wherein the bottom of the cavity is contiguous with a conductive plug.

25. A portion of at least one memory cell of a memory device comprising:

a cavity formed in a structural layer, the cavity having a bottom and at least one sidewall extending from the bottom to an opening in a surface of the structural layer;

a polysilicon layer covering the bottom and the at least one sidewall of the cavity;

a nitride layer covering the polysilicon layer and at least a portion of the surface of the structural layer; and a layer forming an oxygen barrier for the at least one cell, said layer being comprised of a material having a dielectric constant greater than that of the nitride layer, and covering only a portion of the nitride layer including an area around the opening in the surface of the structural layer and partially along the at least one sidewall within the cavity, said layer including one of aluminum oxide, zirconium, hafnium, aluminum nitride, a metallic oxide layer having a higher dielectric constant than the nitride layer, and tungsten oxide.

* * * * *

UNITED STATES PATENT AND TRADEMARK OFFICE
CERTIFICATE OF CORRECTION

| | | |
|---|---|---|
| PATENT NO. | : 6,803,621 B2 | Page 1 of 1 |
| APPLICATION NO. | : 10/286155 | |
| DATED | : October 2, 2004 | |
| INVENTOR(S) | : Sam Yang and Lingyi A. Zheng | |

It is certified that error appears in the above-identified patent and that said Letters Patent is hereby corrected as shown below:

In the specification:

COLUMN 5, LINE 11, change "$(Al_2O_1)$ to --$(Al_2O_3)$--

Signed and Sealed this

Fourth Day of December, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,803,621 B2 |
| APPLICATION NO. | : 10/286155 |
| DATED | : October 12, 2004 |
| INVENTOR(S) | : Sam Yang and Lingyi A. Zheng |

It is certified that error appears in the above-identified patent and that said Letters Patent is hereby corrected as shown below:

In the specification:

COLUMN 5,　LINE 11,　　change "$(Al_2O_1)$" to --$(Al_2O_3)$--

This certificate supersedes Certificate of Correction issued December 4, 2007.

Signed and Sealed this

Twenty-fifth Day of December, 2007

JON W. DUDAS
*Director of the United States Patent and Trademark Office*